United States Patent
Smathers et al.

(10) Patent No.: US 10,902,978 B2
(45) Date of Patent: *Jan. 26, 2021

(54) DIFFUSION BARRIERS FOR METALLIC SUPERCONDUCTING WIRES

(71) Applicants: David B. Smathers, Columbus, OH (US); Paul Aimone, Bridgewater, MA (US)

(72) Inventors: David B. Smathers, Columbus, OH (US); Paul Aimone, Bridgewater, MA (US)

(73) Assignee: H.C. STARCK INC., Newton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/718,542

(22) Filed: Dec. 18, 2019

(65) Prior Publication Data

US 2020/0203041 A1 Jun. 25, 2020

Related U.S. Application Data

(63) Continuation of application No. 16/295,725, filed on Mar. 7, 2019, now Pat. No. 10,546,669, which is a continuation-in-part of application No. 15/964,723, filed on Apr. 27, 2018, now Pat. No. 10,510,470, which is a continuation of application No. 15/696,330, filed on Sep. 6, 2017, now Pat. No. 9,984,795.

(60) Provisional application No. 62/639,530, filed on Mar. 7, 2018, provisional application No. 62/383,676, filed on Sep. 6, 2016.

(51) Int. Cl.
*H01B 12/10* (2006.01)
*H01L 39/12* (2006.01)
*H01L 39/14* (2006.01)
*H01B 12/06* (2006.01)
*H01L 39/24* (2006.01)

(52) U.S. Cl.
CPC .............. *H01B 12/10* (2013.01); *H01B 12/06* (2013.01); *H01L 39/12* (2013.01); *H01L 39/14* (2013.01); *H01L 39/2403* (2013.01); *H01L 39/2406* (2013.01); *H01L 39/2409* (2013.01); *Y02E 40/60* (2013.01)

(58) Field of Classification Search
CPC combination set(s) only.
See application file for complete search history.

(56) References Cited

U.S. PATENT DOCUMENTS

| 3,592,639 A | 7/1971 | Schussler et al. |
| 4,973,527 A * | 11/1990 | Smathers ............ H01L 39/2409 148/98 |
| 10,049,793 B2 | 8/2018 | Aimone et al. |

(Continued)

OTHER PUBLICATIONS

International Search Report and Written Opinion issued in corresponding International Patent Application No. PCT/US2019/021156 dated Mar. 7, 2019, 14 pages.

*Primary Examiner* — Binh B Tran
*Assistant Examiner* — Krystal Robinson
(74) *Attorney, Agent, or Firm* — Morgan, Lewis & Bockius LLP

(57) ABSTRACT

In various embodiments, superconducting wires incorporate diffusion barriers composed of Nb alloys or Nb—Ta alloys that resist internal diffusion and provide superior mechanical strength to the wires.

20 Claims, 4 Drawing Sheets

(56) References Cited

U.S. PATENT DOCUMENTS

| | | |
|---|---|---|
| 2005/0178472 A1* | 8/2005 | Hong .................. C22C 1/02 |
| | | 148/98 |
| 2007/0186998 A1 | 8/2007 | Kato et al. |
| 2007/0238620 A1 | 10/2007 | Flukiger et al. |
| 2009/0005251 A1 | 1/2009 | Flukiger et al. |
| 2009/0305897 A1 | 12/2009 | Grasso et al. |
| 2010/0093546 A1 | 4/2010 | Schlenga et al. |
| 2011/0190139 A1 | 8/2011 | Ohata et al. |
| 2012/0108437 A1 | 3/2012 | Ohata et al. |
| 2013/0053250 A1 | 2/2013 | Ohata et al. |
| 2013/0316909 A1 | 11/2013 | Banno et al. |
| 2015/0024943 A1 | 1/2015 | Sugimoto et al. |
| 2015/0345679 A1 | 12/2015 | Hagiya |
| 2015/0348679 A1 | 12/2015 | Takeuchi et al. |
| 2017/0309375 A1 | 10/2017 | Aimone et al. |
| 2018/0374612 A1 | 12/2018 | Aimone et al. |
| 2019/0267160 A1 | 8/2019 | Smathers et al. |

* cited by examiner

DIFFUSION BARRIERS FOR METALLIC SUPERCONDUCTING WIRES

RELATED APPLICATIONS

This application is a continuation of U.S. patent application Ser. No. 16/295,725, filed Mar. 7, 2019, which claims the benefit of and priority to U.S. Provisional Patent Application No. 62/639,530, filed Mar. 7, 2018, the entire disclosure of each of which is hereby incorporated herein by reference. U.S. patent application Ser. No. 16/295,725, filed Mar. 7, 2019, is also a continuation-in-part of U.S. patent application Ser. No. 15/964,723, filed Apr. 27, 2018, which is a continuation of U.S. patent application Ser. No. 15/696,330, filed Sep. 6, 2017, which claims the benefit of and priority to U.S. Provisional Patent Application No. 62/383,676, filed Sep. 6, 2016, the entire disclosure of each of which is hereby incorporated herein by reference.

TECHNICAL FIELD

In various embodiments, the present invention relates to the formation and processing of superconducting wires that incorporate diffusion barriers for prevention of interdiffusion.

BACKGROUND

A superconducting material exhibits no electrical resistance when cooled below its characteristic critical temperature. Although high-temperature superconductor materials, which have critical temperatures higher than the 77K boiling point of nitrogen, have been identified, these materials are often exotic (e.g., perovskite ceramics), difficult to process, and unsuitable for high-field applications. Thus, for practical superconducting applications requiring wires and coils and bundles thereof, the metallic superconductors Nb—Ti and $Nb_3Sn$ are most often utilized. While these materials have critical temperatures below 77K, the relative ease of processing these materials (e.g., drawing into wires), as well as their ability to operate at high currents and high magnetic fields, have resulted in their widespread use.

Typical metallic superconducting wires feature multiple strands (or "filaments") of the superconducting phase embedded within a copper (Cu) conductive matrix. While Nb—Ti is sufficiently ductile to be drawn down into thin wires directly, its applicability is typically limited to applications featuring magnetic fields having strengths below approximately 8 Tesla. $Nb_3Sn$ is a brittle intermetallic phase that cannot withstand wire-drawing deformation, and thus it is typically formed after wire drawing via diffusion heat treatment. $Nb_3Sn$ superconducting materials may typically be used in applications featuring magnetic fields having strengths up to at least 20 Tesla. Thus, several different techniques have been utilized to fabricate $Nb_3Sn$-based superconducting wires. For example, in the "bronze process," a large composite is fabricated from Nb rods and Cu—Sn alloy rods (that include, e.g., 13-15% Sn) surrounding the Nb rods. Since these materials are ductile, the composite may be drawn down to a suitable diameter, and then the drawn-down composite is annealed. The heat treatment results in interdiffusion and the formation of the $Nb_3Sn$ phase at the interface between the Nb and the Cu—Sn. Other processes for forming $Nb_3Sn$-based superconducting wires similarly involve formation of the brittle $Nb_3Sn$ phase after wire drawing. For example, pure Sn or Sn alloys with Cu or Mg may be incorporated in the interior of the initial composite and annealed after drawing. Alternatively, Nb filaments may be embedded within a Cu matrix and drawn down into wire. The resulting wire may subsequently be coated with Sn. The coated wire is heated, forming a Sn—Cu phase that eventually reacts with the Nb filaments to form the $Nb_3Sn$ phase.

While the techniques detailed above have resulted in the successful fabrication of metallic superconducting wires utilized for a host of different applications, the resulting wires often exhibit insufficient electrical performance. Typical superconducting wires contain many of the $Nb_3Sn$ or Nb—Ti filaments described above embedded within, disposed around, and/or surrounded by a Cu or Cu-containing stabilizer that provides the wires with sufficient ductility for handling and incorporation within industrial systems. Although this stabilizer is not itself superconducting, the high electrical conductivity of Cu can enable satisfactory overall electrical performance of the wire. Unfortunately, various elements from the superconducting filaments (e.g., Sn) may react with portions of the Cu-based stabilizer, forming low-conductivity phases that negatively impact the overall conductivity of the entire wire. While diffusion barriers have been utilized to shield the stabilizer from the superconducting filaments, these barriers tend to have non-uniform cross-sectional areas and may even locally rupture due to non-uniform deformation during co-processing of the diffusion barrier and the stabilizer. While such diffusion barriers could simply be made thicker, such solutions impact the overall conductivity of the wire due to the lower electrical conductivity of the diffusion barrier material itself. For example, for cutting-edge and future applications such as new particle accelerators and colliders, magnets are being designed beyond existing wire capabilities; such wires will require a non-copper critical current density of more than 2000 $A/mm^2$ at 15 Tesla. As the diffusion barrier is part of the non-copper fraction, minimizing the volume of any barrier material is important while any strength benefit is advantageous.

In view of the foregoing, there is a need for improved diffusion barriers for metallic superconducting wires that substantially prevent deleterious reactions involving a stabilizer or various elements (e.g., Cu) while remaining uniformly thin so as not to occupy a significant amount of the overall cross-sectional area of the wire.

SUMMARY

In accordance with various embodiments of the present invention, a superconducting wire and/or precursor thereof (e.g., a composite filament utilized to form the wire) features one or more diffusion barriers including, consisting essentially of, or consisting of a niobium (Nb) alloy. A diffusion barrier is typically disposed between at least a portion of the Cu wire matrix and the superconducting filaments, and/or between the superconducting filaments and a stabilizing element incorporated within and/or around the superconducting wire for additional mechanical strength. In accordance with embodiments of the invention, monofilaments may each include, consist essentially of, or consist of a Nb-based core within a Cu-based (e.g., Cu or bronze (Cu—Sn)) matrix, and stacked assemblies of the monofilaments may be disposed within a Cu-based matrix and drawn down to form composite filaments. Thus, composite filaments may each include, consist essentially of, or consist of multiple Nb-based monofilaments within a Cu-based matrix. A diffusion barrier in accordance with embodiments of the invention may be disposed around each composite filament when the composite filaments are stacked to form the final wire, and/or a diffusion barrier may be disposed around the stack of composite filaments and between the stack of composite filaments and an outer Cu stabilizer or matrix.

In various embodiments, composite filaments are disposed within a Cu-based matrix (e.g., a Cu-based tube) and drawn down into the superconducting wire (or precursor thereof) and heat treated. One or more of the composite filaments may themselves incorporate a diffusion barrier therein, and/or a diffusion barrier may be disposed within the Cu-based matrix of the superconducting wire and around the composite filaments. In various embodiments, the diffusion barrier includes, consists essentially of, or consists of a Nb—W alloy including, e.g., 0.1% to 20% W, 0.2% to 15% W, 0.2% to 12% W, 0.2% to 10% W, 0.2% to 8% W, or 0.2% to 5% W. For example, the diffusion barrier may include, consist essentially of, or consist of an alloy of Nb and approximately 11%-12% W (i.e., Nb-12W) or an alloy of Nb and approximately 5%-6% W (i.e., Nb-6W) or an alloy of Nb and approximately 2.5%-3% W (i.e., Nb-3W). In various embodiments, the diffusion barrier includes, consists essentially of, or consists of a Nb—W alloy (e.g., Nb-12W, Nb-6W, or Nb-3W) with one or more additional alloying elements therein, e.g., alloying elements such as Ru, Pt, Pd, Rh, Os, Ir, Mo, Re, and/or Si. Such alloying elements may be present in the diffusion barrier individually or collectively at concentrations up to 5% by weight or even up to 10% by weight (e.g., between 0.05% and 10%, between 0.05% and 5%, between 0.1% and 3%, between 0.2% and 2%, between 0.2% and 1%, or between 0.2% and 0.5%). In various embodiments of the invention, welds formed of Nb—W alloys incorporating one or more of these additional alloying elements may have grain structures that are more equiaxed toward the center of such welds; thus, welded tubes formed of these materials for use as diffusion barriers may exhibit superior mechanical properties and processability when drawn down to small sizes during wire fabrication.

In accordance with various embodiments of the invention, a diffusion barrier may include one or more alloying elements such as W, Ru, Pt, Pd, Rh, Os, Ir, Mo, Re, and/or Si. Such alloying elements may be present in the diffusion barrier individually or collectively at concentrations up to 5% by weight or even up to 10% by weight (e.g., between 0.05% and 10%, between 0.05% and 5%, between 0.1% and 3%, between 0.2% and 2%, between 0.2% and 1%, or between 0.2% and 0.5%). In various embodiments, filaments and/or diffusion barriers in accordance with embodiments of the invention may be substantially free of Mg, B, Fe, Al, and/or Ni.

In various embodiments of the invention, a diffusion barrier may include, consist essentially of, or consist of an alloy or mixture containing both Nb and tantalum (Ta), as well as one or more alloying elements such as W. For example, the diffusion barrier may include, consist essentially of, or consist of an alloy of Nb, Ta, and approximately 2.5-3 atomic % W (i.e., Nb—Ta-3W), with or without one or more of the alloying elements listed above. In various embodiments, diffusion barriers including, consisting essentially of, or consisting of Nb—Ta—W alloys may contain W in concentrations of, e.g., 0.2-12 atomic %. Diffusion barriers in accordance with embodiments of the invention may include at least 1% Ta, at least 5% Ta, at least 8% Ta, at least 10% Ta, at least 15% Ta, at least 20% Ta, at least 25% Ta, at least 30% Ta, at least 35% Ta, at least 40% Ta, or at least 45% Ta. Diffusion barriers in accordance with embodiments of the invention may include at most 50% Ta, at most 45% Ta, at most 40% Ta, at most 35% Ta, at most 30% Ta, at most 25% Ta, at most 20% Ta, at most 15% Ta, at most 10% Ta, at most 5% Ta, or at most 2% Ta.

Diffusion barriers in accordance with embodiments of the invention may include, consist essentially of, or consist of an alloy or mixture containing Nb (or Nb and Ta) and one or more alloying elements instead of (or in addition to) W. For example, such alloying elements may include C and/or N. References herein to diffusion-barrier alloys containing W are understood to encompass alloys containing alloying elements such as C and/or N instead of or in addition to W.

Nb-alloy diffusion barriers in accordance with embodiments of the invention may also exhibit advantageous ductility due at least in part to low oxygen contents and/or high levels of purity. For example, diffusion barriers in accordance with embodiments of the invention have oxygen contents less than 500 ppm, less than 200 ppm, less than 100 ppm, or even less than 50 ppm. The oxygen content may be at least 0.5 ppm, at least 1 ppm, at least 2 ppm, or at least 5 ppm. In addition or alternatively, diffusion barriers in accordance with embodiments of the invention may have purities exceeding 99.9%, or even exceeding 99.99%.

Advantageously, Nb-alloy diffusion barriers in accordance with embodiments of the invention have refined grain structures (e.g., small average grain sizes) when compared to conventional diffusion barrier materials, and this enables the deformation and processing of the diffusion barriers within the superconducting wire to be substantially uniform without localized thinning that can rupture the diffusion barrier and compromise the performance of the wire. The small grain size of the diffusion barriers (e.g., less than 20 µm, less than 10 µm, less than 5 µm, between 1 and 20 µm, or between 5 and 15 µm) results from the presence of the alloying element(s), and thus diffusion barriers in accordance with embodiments of the invention need no additional processing (e.g., forging such as tri-axial forging, heat treatments, etc.) to produce the refined grain structure. Thus, overall manufacturing costs and complexity may be reduced via use of diffusion barriers in accordance with the present invention.

The superior grain structure and/or mechanical properties of diffusion barriers in accordance with embodiments of the present invention enable the diffusion barriers to provide protection from deleterious diffusion within the superconductor wire without occupying excessive amounts of the cross-sectional (i.e., current-carrying) area of the wire. (In contrast, the use of various other diffusion barriers with lesser mechanical properties and/or less refined grain structures would require the use of larger barriers that would deleteriously impact the ductility, conductivity, and/or various other properties of the final wire.) Wires in accordance with embodiments of the present invention exhibit little or no interdiffusion with the Cu matrix while retaining good high-field, high-current superconducting properties below their critical temperatures.

The use of Nb-alloy diffusion barriers advantageously enables less of the cross-section of the superconducting wire to be occupied by the diffusion barrier, and thus more of the cross-section may be occupied by current-carrying superconducting filaments. However, diffusion-barrier materials in accordance with embodiments of the invention also advantageously provide additional mechanical strength to the superconducting wire while retaining good high-field, high-current superconducting properties below their critical temperatures. In various embodiments, the mechanical strength of wires may facilitate mechanical deformation of the wire (e.g., winding, coiling, etc.) without compromising the electrical performance of the wire and/or without causing cracks or fractures in, or otherwise compromising the mechanical stability of, the wire and/or its filaments. In various embodiments, the diffusion barrier(s) may collectively or individually occupy at least 0.5%, at least 1%, at least 2%, at least 3%, at least 4%, at least 5%, or at least 7% of the cross-sectional area of the final wire. In various embodiments, the diffusion barrier(s) may collectively or individually occupy less than 20%, less than 15%, less than 12%, less than 10%, less than 9%, less than 8%, less than 7%, less than 6%, less than 5%, less than 4%, less than 3%, or less than 2% of the cross-sectional area of the final wire. In this manner, the diffusion barrier(s) within the superconducting wire provide, in accordance with various embodiments, the wire with a minimum yield strength (e.g., after any heat treatment of the wire and/or of the filaments) of at least 75 MPa, at least 100 MPa, or even at least 150 MPa. Instead or in addition, wires containing one or more diffusion barriers in accordance with various embodiments exhibit ultimate tensile strengths of at least 250 MPa, at least 300 MPa, or even at least 350 MPa. In various embodiments, the diffusion barrier(s) may collectively or individually occupy more than 25% of the cross-sectional area of the final wire, and/or less than 35%, or less than 30% of the cross-sectional area of the final wire. Mechanical properties such as yield strengths and ultimate tensile strengths of wires in accordance with embodiments of the present invention may be measured in accordance with ASTM E8/E8M-15a, Standard Test Methods for Tension Testing of Metallic Materials, ASTM International, West Conshohocken, Pa., 2015, the entire disclosure of which is incorporated by reference herein.

The enhanced mechanical strength of superconducting wires in accordance with embodiments of the invention advantageously enables such wires to withstand Lorentz forces exerted on the wire during operation at high magnetic field strengths. As known in the art, the "self-field" in a magnet winding is higher than the center-line field and is highest at the innermost winding. In addition, the current required to create the field is the same in all the wire in the magnet. The Lorentz force is $F=B \times I$ (i.e., magnetic field crossed into current), and the generated field is directly proportional to the current I; thus, the force is proportional to the square of the current. For example, the Lorentz forces will be four times higher at 16 Tesla compared to 8 Tesla. Thus, as the applied magnetic field is increased in magnitude, the mechanical strength of the wire to withstand the force (perpendicular to both current and field, via the cross-product relation) must be higher as well. Superconducting wires in accordance with embodiments of the invention may be advantageously deployed for applications utilizing magnetic fields having strengths of at least 2 Tesla, at least 5 Tesla, at least 8 Tesla, or even at least 10 Tesla, i.e., magnetic flux densities of at least 20,000 gauss, at least 50,000 gauss, at least 80,000 gauss, or even at least 100,000 gauss.

In addition, since diffusion barriers in accordance with embodiments of the invention include Nb, in various embodiments a portion of the diffusion barrier may advantageously react (e.g., with Sn or Ti) during the wire fabrication process (e.g., during one or more heat treatment/annealing steps) to form a superconducting phase (e.g., $Nb_3Sn$ or Nb—Ti) that contributes to superconductive conductivity of the final wire. In such embodiments, the thickness of the diffusion barrier is typically sufficiently large to prevent the entire diffusion barrier (or at least the Nb therewithin) from reacting, and thus the remaining unreacted portion of the diffusion barrier provides not only resistance to interdiffusion but also increased mechanical strength (due to, e.g., the presence of alloying elements such as W). In various embodiments, the reacted portion of the diffusion barrier is therefore present within the wire as an annular (or other shape, mimicking the shape of the diffusion barrier) reacted region. In various embodiments, non-Nb alloying elements (e.g., Ta, W, etc.) may not react to form the superconducting phase in the reacted region, and thus those elements may be expelled from the reacting portion of the diffusion barrier during the reaction. Thus, at the interface between the reacted portion of the diffusion barrier and the unreacted, remaining portion of the diffusion barrier, one or more (or even all) of such non-Nb elements may be present at a concentration higher than that within the portion of the diffusion barrier opposite the reacted portion. In other embodiments, the unreacted, remaining portion of the diffusion barrier contains a higher concentration of one or more such non-Nb elements than was present prior to the reaction (e.g., when the diffusion barrier was introduced during the wire fabrication process). Thus, even though after a portion of the diffusion barrier reacts to form a superconducting phase, the thickness of the remaining diffusion barrier is reduced, the higher concentration of one or more non-Nb elements therewithin may increase the mechanical strength and/or diffusion resistance of the remaining, thinner diffusion barrier notwithstanding its reduced thickness.

In various embodiments, the diffusion barrier may be a multi-layer annular structure in which one or more of the layers include, consist essentially of, or consist essentially of an Nb alloy as detailed herein, and one or more other layers include, consist essentially of, or consist of Nb (or an Nb alloy containing a lesser concentration of one or more of the non-Nb alloying elements; references herein to "Nb layers" or "layers of Nb" include such layers). For example, the diffusion barrier may include, consist essentially of, or consist of an inner layer of Nb surrounded by an outer layer of the Nb alloy, or vice versa. In another embodiment, the diffusion barrier may include, consist essentially of, or consist of a layer of the Nb alloy sandwiched between an inner layer of Nb and an outer layer of Nb. As detailed herein, during heat treatment, all or a portion of the Nb layer(s) of the diffusion barrier may be converted into the superconducting phase, while the Nb-alloy layer(s) remain unconverted.

Embodiments of the present invention may also incorporate stabilizing elements within the wires themselves and/or within the composite filaments utilized to form the wire. For example, embodiments of the invention may incorporate stabilizing elements that include, consist essentially of, or consist of Ta, a Ta alloy (e.g., an alloy of Ta and W such as Ta-3W), or an alloy of Nb with one or more of Hf, Ti, Zr, Ta, V, Y, Mo, or W, as described in U.S. patent application Ser. No. 15/205,804, filed on Jul. 8, 2016 ("the '804 application"), the entire disclosure of which is incorporated by reference herein. In superconducting wires in accordance with the present invention, stabilizing elements are typically separated from monofilaments and/or composite filaments via one or more diffusion barriers therebetween.

In an aspect, embodiments of the invention feature a superconducting wire that includes, consists essentially of, or consists of an outer wire matrix, a diffusion barrier disposed within the wire matrix, and a plurality of composite filaments surrounded by the diffusion barrier and separated from the outer wire matrix by the diffusion barrier. The outer wire matrix includes, consists essentially of, or consists of Cu. The diffusion barrier includes, consists essentially of, or consists of a Nb—W alloy (e.g., a Nb alloy containing 0.1%-20% W or 0.2%-12% W or 0.2%-10% W) or a Nb—Ta—W alloy. One or more, or even each, of the composite filaments includes, consists essentially of, or consists of (i) a plurality of monofilaments and (ii) a cladding surrounding the plurality of monofilaments. The composite-filament cladding may include, consist essentially of, or consist of Cu. One or more, or even each, of the monofilaments includes, consists essentially of, or consists of a core and a cladding surrounding the core. The monofilament core may include, consist essentially of, or consist of Nb. The monofilament cladding may include, consist essentially of, or consist of Cu. The diffusion barrier extends through an axial dimension of the superconducting wire.

Embodiments of the invention may include one or more of the following in any of a variety of combinations. The diffusion barrier may occupy less than approximately 20% of a cross-section of the wire, less than approximately 15% of a cross-section of the wire, less than approximately 10% of a cross-section of the wire, or less than approximately 5% of a cross-section of the wire. The diffusion barrier may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire. The wire may include an annular region or layer disposed proximate the diffusion barrier (e.g., on either or both sides thereof, for example, disposed between the composite filaments and the diffusion barrier), and at least a portion of the annular region may include, consist essentially of, or consist of a Nb-based superconducting phase (e.g., Nb—Ti and/or $Nb_3Sn$). A portion of the annular region may include, consist essentially of, or consist of a Nb alloy or Nb—Ta alloy having a composition different from that of the diffusion barrier. The annular region may conform to and/or be in direct mechanical contact with the diffusion barrier.

The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of $Nb_3Sn$. The diffusion barrier may include, consist essentially of, or consist of Nb-3W or Nb-6W or Nb-12W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire).

The wire may include a stabilizing element disposed within the plurality of composite filaments and surrounded by the diffusion barrier. The stabilizing element may include, consist essentially of, or consist of Cu and/or a Ta alloy containing 0.1%-20% W or 0.2%-12% W or 0.2%-10% W. At least a portion of the stabilizing element may be located substantially at the central core of the superconducting wire. The stabilizing element may occupy less than approximately 20% of a cross-section of the wire, less than approximately 15% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In another aspect, embodiments of the invention feature a superconducting wire that includes, consists essentially of, or consists of a wire matrix and a plurality of composite filaments embedded within the wire matrix. The wire matrix includes, consists essentially of, or consists of Cu. One or more, or even each, of the composite filaments includes, consists essentially of, or consists of (i) a plurality of monofilaments, (ii) a diffusion barrier extending through an axial dimension of the composite filament and surrounding the plurality of monofilaments, and (iii) a cladding surrounding the diffusion barrier, the diffusion barrier separating the cladding from the plurality of monofilaments. The composite-filament diffusion barrier includes, consists essentially of, or consists of a Nb—W alloy or a Nb—Ta—W (e.g., a Nb alloy or a Nb—Ta alloy containing 0.1%-20% W or 0.2%-12% W or 0.2%-10% W). The composite-filament cladding includes, consists essentially of, or consists of Cu. One or more, or even each, of the monofilaments includes, consists essentially of, or consists of a core and a cladding surrounding the core. The monofilament core may include, consist essentially of, or consist of Nb. The monofilament cladding may include, consist essentially of, or consist of Cu.

Embodiments of the invention may include one or more of the following in any of a variety of combinations. The diffusion barriers may collectively occupy less than approximately 20% of a cross-section of the wire, less than approximately 15% of a cross-section of the wire, less than approximately 10% of a cross-section of the wire, or less than approximately 5% of a cross-section of the wire. The diffusion barriers may collectively occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire. The wire may include an annular region or layer disposed proximate at least one diffusion barrier (e.g., on either or both sides thereof, for example, disposed between the monofilaments and the diffusion barrier of at least one of the composite filaments), and at least a portion of the annular region may include, consist essentially of, or consist of a Nb-based superconducting phase (e.g., Nb—Ti and/or $Nb_3Sn$). A portion of the annular region may include, consist essentially of, or consist of a Nb alloy or Nb—Ta alloy having a composition different from that of the diffusion barrier. The annular region may conform to and/or be in direct mechanical contact with the diffusion barrier.

The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of $Nb_3Sn$. The diffusion barrier may include, consist essentially of, or consist of Nb-3W, Nb-6W, or Nb-12W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire).

The wire may include a stabilizing element disposed within the plurality of composite filaments. The stabilizing element may include, consist essentially of, or consist of Cu and/or a Ta alloy containing 0.1%-20% W or 0.2%-12% W or 0.2%-10% W. At least a portion of the stabilizing element may be located substantially at the central core of the superconducting wire. The stabilizing element may occupy less than approximately 20% of a cross-section of the wire, less than approximately 15% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In yet another aspect, embodiments of the invention feature a superconducting wire that includes, consists essentially of, or consists of an inner wire stabilizing matrix, a diffusion barrier disposed around the wire stabilizing matrix, and a plurality of composite filaments disposed around the diffusion barrier and separated from the wire stabilizing matrix by the diffusion barrier. The wire stabilizing matrix includes, consists essentially of, or consists of Cu. The diffusion barrier includes, consists essentially of, or consists of a Nb—W alloy or a Nb—Ta—W alloy (e.g., a Nb alloy or a Nb—Ta alloy containing 0.1%-20% W or 0.2%-12% W or 0.2%-10% W). One or more, or even each, of the composite filaments includes, consists essentially of, or consists of (i) a plurality of monofilaments, and (ii) (iii) a cladding surrounding the plurality of monofilaments. The composite-filament cladding includes, consists essentially of, or consists of Cu. The diffusion barrier extends through an axial dimension of the wire.

Embodiments of the invention may include one or more of the following in any of a variety of combinations. The diffusion barrier may occupy less than approximately 20% of a cross-section of the wire, less than approximately 15% of a cross-section of the wire, less than approximately 10% of a cross-section of the wire, or less than approximately 5% of a cross-section of the wire. The diffusion barrier may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire. The wire may include an annular region or layer disposed proximate the diffusion barrier (e.g., on either or both sides thereof, for example, disposed between the composite filaments and the diffusion barrier), and at least a portion of the annular region may include, consist essentially of, or consist of a Nb-based superconducting phase (e.g., Nb—Ti and/or $Nb_3Sn$). A portion of the annular region may include, consist essentially of, or consist of a Nb alloy or Nb—Ta alloy having a composition different from that of the diffusion barrier. The annular region may conform to and/or be in direct mechanical contact with the diffusion barrier.

The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of $Nb_3Sn$. The diffusion barrier may include, consist essentially of, or consist of Nb-3W or Nb-6W or Nb-12W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire).

The wire may include a stabilizing element disposed within the plurality of composite filaments or within or proximate the inner wire stabilizing matrix. The stabilizing element may include, consist essentially of, or consist of Cu and/or a Ta alloy containing 0.1%-20% W or 0.2%-12% W or 0.2%-10% W. At least a portion of the stabilizing element may be located substantially at the central core of the superconducting wire. The stabilizing element may occupy less than approximately 20% of a cross-section of the wire, less than approximately 15% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of multiple metals will generally include only those metals and only unintentional impurities (which may be metallic or non-metallic) that may be detectable via chemical analysis but do not contribute to function (and may be present at concentrations of, e.g., less than 5 ppm, 2 ppm, 1 ppm, 0.5 ppm, or 0.1 ppm). As used herein, "consisting essentially of at least one metal" refers to a metal or a mixture of two or more metals but not compounds between a metal and a non-metallic element or chemical species such as oxygen, silicon, or nitrogen (e.g., metal nitrides, metal silicides, or metal oxides); such non-metallic elements or chemical species may be present, collectively or individually, in trace amounts, e.g., as impurities.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
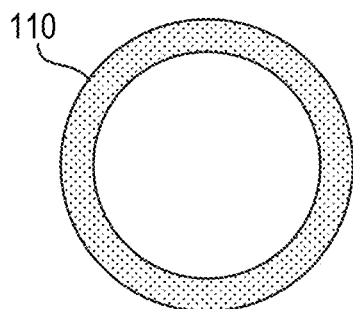
FIG. 1A is a schematic cross-sectional view of a tube utilized to form a monofilament in accordance with various embodiments of the invention.
Figure 1B:
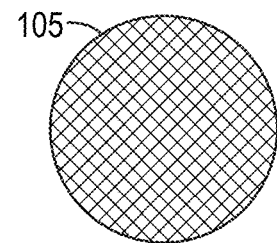
FIG. 1B is a schematic cross-sectional view of a rod utilized to form a monofilament in accordance with various embodiments of the invention.
Figure 1C:
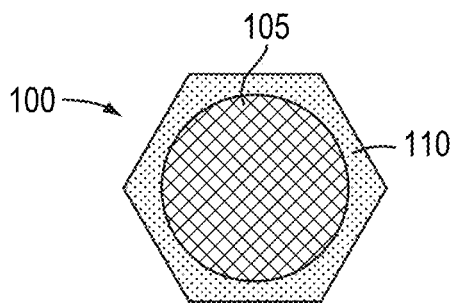
FIG. 1C is a schematic cross-sectional view of a monofilament utilized to form a composite filament in accordance with various embodiments of the invention.

FIGS. 1A-1C depict components of an exemplary monofilament 100 and constituent components thereof. In accordance with embodiments of the invention, a rod 105 is disposed within a tube 110 that includes, consists essentially of, or consists of Cu or a Cu alloy (e.g., bronze). The composition of the rod 105 may be selected based on the particular metallic superconductor desired in the final wire. For example, the rod 105 may include, consist essentially of, or consist of Nb, Ti, Nb—Ti, or an alloy thereof. In other examples, the rod 105 may include, consist essentially of, or consist of Nb alloyed with one or more of Ti, Zr, Hf, Ta, Y, or La. Such alloying elements may be individually or collectively present within the rod 105 (and thus within the core of a monofilament 100) is concentrations of, for example, 0.2%-10% (e.g., 0.2%-5%, or 0.5%-1%). In various embodiments, the tube 110 (and/or any other tube described herein) may be formed by wrapping a metallic sheet around the rod 105; in such embodiments, the ends of the sheet may overlap. The rod 105 clad with the tube 110 may subsequently be drawn down to reduce its diameter to, for example, between 0.5 inch and 1.5 inches. The clad rod may be drawn down in multiple stages and may be heat treated during and/or after any or each of the drawing steps for, e.g., strain relief. Once drawn down, the clad rod may be drawn through a shaped die in order to fabricate the monofilament 100 shaped for efficient stacking with other monofilaments. For example, as shown in FIG. 1C, a hexagonal die may be utilized to form a monofilament 100 having a hexagonal cross-section. In other embodiments, monofilaments may have other cross-sections, e.g., square, rectangular, triangular, etc. As shown in FIG. 1C, a monofilament 100 typically includes, consists essentially of, or consists of a single annular cladding disposed around and surrounding a single cylindrical core having a substantially uniform composition; thus, regions of a superconducting wire in accordance with embodiments of the invention containing multiple clad and separated cylindrical cores correspond to multiple "monofilaments" or a single "composite filament."

Figure 2A:
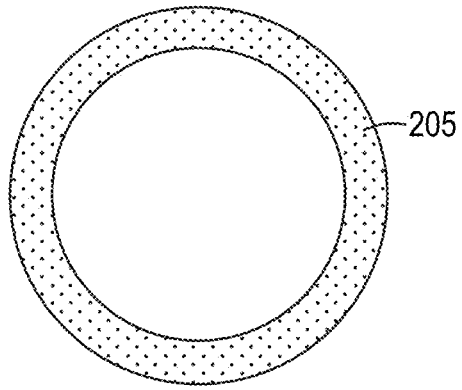
FIG. 2A is a schematic cross-sectional view of a tube utilized to form a composite filament in accordance with various embodiments of the invention.
Figure 2B:
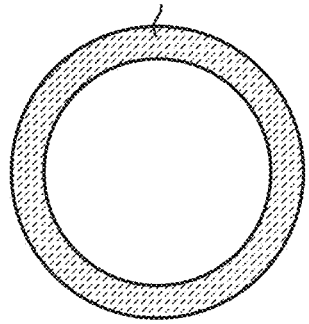
FIG. 2B is a schematic cross-sectional view of a tube utilized to form a diffusion barrier within a composite filament in accordance with various embodiments of the invention.
Figure 2C:
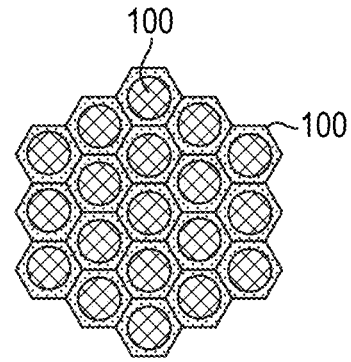
FIG. 2C is a schematic cross-sectional view of a stack of monofilaments utilized to form a composite filament in accordance with various embodiments of the invention.

Once a monofilament 100 is fabricated, other monofilaments 100 may also be fabricated in the same manner, or one or more monofilaments 100 may be divided into multiple pieces. Multiple monofilaments may be stacked together to form at least a portion of a composite filament. FIGS. 2A-2E depict various components and assembly of a composite filament 200. As shown in FIG. 2C, multiple monofilaments 100 may be stacked together in an arrangement that will subsequently become at least a portion of the core of composite filament 200. While FIG. 2C depicts the stacking of 19 different monofilaments 100, embodiments of the invention may include more or fewer monofilaments 100. The stacked assembly of monofilaments 100 may be disposed within a tube 205 that includes, consists essentially of, or consists of Cu or a Cu alloy (e.g., bronze). As shown in FIG. 2B, a tube 210 may be disposed within the tube 205 and around the stack of monofilaments 100; this tube 210 will become the diffusion barrier 215 in the final composite filament and retard or substantially prevent interdiffusion between the monofilaments 100 and the material of tube 205, which becomes the outer matrix 220 of the resulting composite filament. Thus, the tube 210 may include, consist essentially of, or consist of a Nb alloy or a Nb—Ta alloy such as Nb—W (e.g., Nb-12W or Nb-6W or Nb-3W) or Nb—Ta—W (e.g., Nb—Ta-12W or Nb—Ta-6W or Nb—Ta-3W). Before and/or after the monofilaments 100 are disposed within the tube 205 and the tube 210, the monofilaments 100, the tube 205, and/or the tube 210 may be cleaned and/or etched (e.g., via a cleaning agent including, consisting essentially of, or consisting of one or more acids) to, for example, remove surface oxides and/or other contaminants.

The tube 210 may be fabricated via alloying of pure Nb or a Nb—Ta alloy with the one or more other alloying elements disposed within the diffusion barrier. For example, for diffusion barriers (and thus tubes 210) including, consisting essentially of, or consisting of an alloy of Nb and W, Nb and W may be alloyed together in the desired amounts via a process such as electron-beam melting and/or arc melting. Similarly, for diffusion barriers (and thus tubes 210) including, consisting essentially of, or consisting of an alloy of Nb, Ta, and W, Nb, Ta, and W may be alloyed together in the desired amounts via a process such as electron-beam melting and/or arc melting. The resulting material may be fabricated into a sheet, and the sheet may be formed into a tube by, e.g., rolling, deep drawing, extrusion, pilgering, etc.

Figure 2D:
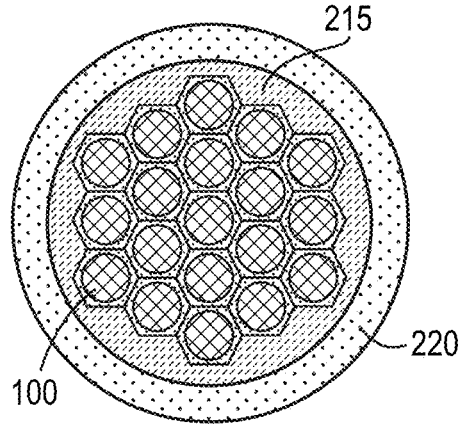
FIG. 2D is a schematic cross-sectional view of a composite filament at an initial stage of fabrication in accordance with various embodiments of the invention.

As shown in FIG. 2D, the tube 205 and tube 210 may be compacted onto the monofilaments 100 by, e.g., swaging, extruding, and/or rolling. The clad stacked monofilaments 100 may be annealed to promote bonding between the various monofilaments 100 in the stacked assembly. For example, the clad stacked monofilaments may be annealed at a temperature between approximately 300° C. and approximately 500° C. (e.g., approximately 400° C.) for a time of approximately 0.5 hour and approximately 3 hours (e.g., approximately 1 hour). Advantageously, the presence of the diffusion barrier 215 between the monofilaments 100 and the outer matrix 220 substantially prevents diffusion between the Cu of the matrix 220 and the monofilaments 100, thereby preventing the formation of metallic phases having low electrical conductivity (e.g., electrical conductivity lower than Cu and/or than the material of matrix 220). The diffusion barrier 215 also provides additional mechanical strength to the final wire, given its superior mechanical properties (e.g., strength, yield strength, tensile strength, stiffness, Young's modulus, etc.) compared with those of the outer matrix 220 and/or the monofilaments 100, particularly after the extended high-temperature heat treatments utilized for reactive formation of the superconducting phase in the wire.

Figure 2E:
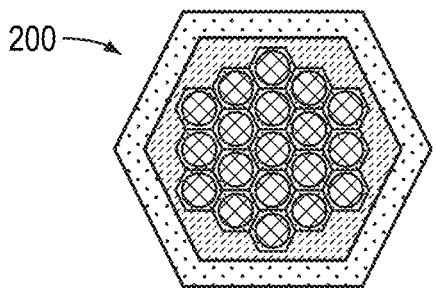
FIG. 2E is a schematic cross-sectional view of a composite filament utilized to form superconducting wires in accordance with various embodiments of the invention.
Figure 5:
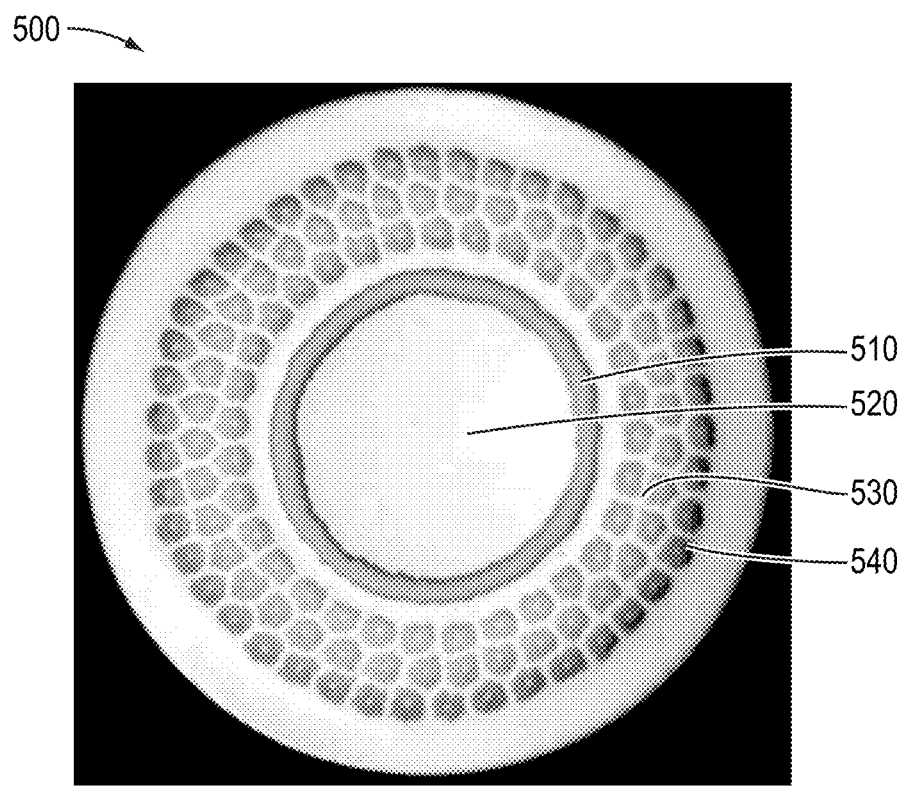
FIG. 5 is a cross-sectional micrograph of a superconducting wire featuring a Cu inner stabilizer and a diffusion barrier disposed around the stabilizer in accordance with various embodiments of the invention.
Figure 6:
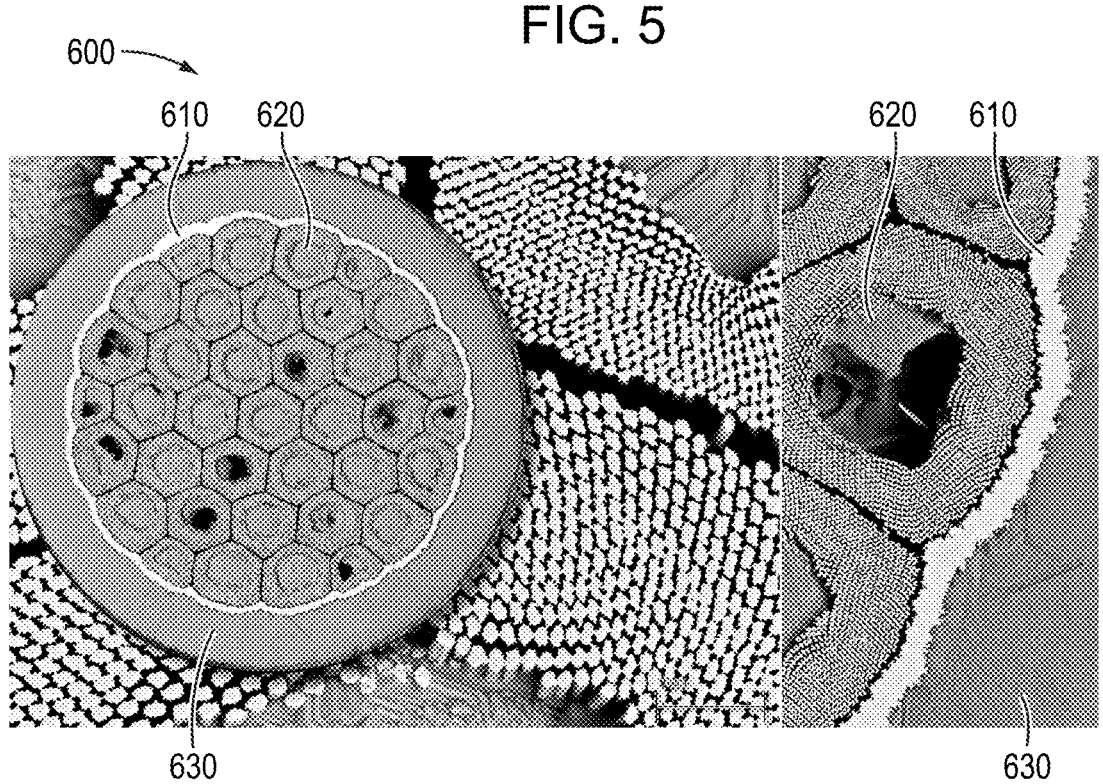
FIG. 6 is a cross-sectional micrograph of a superconducting wire featuring a Cu outer matrix and a diffusion barrier disposed between the outer matrix and the wire filaments in accordance with various embodiments of the invention.

The resulting assembly may be drawn down one or more times to reduce its diameter, and may subsequently be drawn through a shaped die in order to provide composite filament 200 with a cross-sectional shape configured for efficient stacking. For example, as shown in FIG. 2E, a hexagonal die may be utilized to form a composite filament 200 having a hexagonal cross-section. In other embodiments, composite filaments 200 may have other cross-sections, e.g., square, rectangular, triangular, round, off-round, elliptical, etc. In various embodiments, the cross-sectional size and/or shape of the composite filament 200 after processing and shaping is equal to the cross-sectional size and/or shape of the monofilament 100 utilized in the initial stacked assembly before being reduced in size (i.e., shown in FIG. 2C). (Although the diffusion barrier 215 resulting from the incorporation of tube 210 is depicted in FIGS. 2D and 2E as having a variable cross-sectional thickness, in various embodiments of the invention the diffusion barrier 215 has a substantially uniform cross-sectional thickness around its circumference, and diffusion barrier 215 may have the form, in cross-section, of an annular ring (for example, a ring disposed tightly around the filaments (or other structures) therewithin), as shown in FIGS. 5 and 6; diffusion barriers having an annular cross-section in accordance with embodiments of the invention generally have the form of cylinders that extend along the axial dimension of the wire.)

Figure 3A:
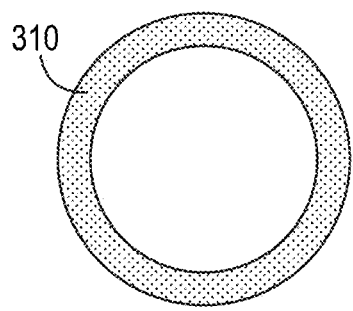
FIG. 3A is a schematic cross-sectional view of a tube utilized to form a stabilizing element in accordance with various embodiments of the invention.
Figure 3B:
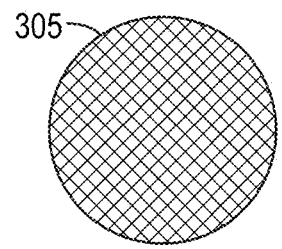
FIG. 3B is a schematic cross-sectional view of a rod utilized to form a stabilizing element in accordance with various embodiments of the invention.
Figure 3C:
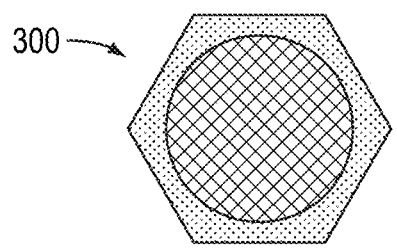
FIG. 3C is a schematic cross-sectional view of a stabilizing element utilized to form stabilized composite filaments and/or superconducting wires in accordance with various embodiments of the invention.

Superconducting wires in accordance with embodiments of the invention may also incorporate stabilizing elements that provide even more mechanical strength while not compromising the drawability and/or electrical performance of the wires. FIGS. 3A-3C depict the fabrication of a stabilizing element 300 via a method similar to that detailed above for monofilaments 100. In accordance with embodiments of the invention, a rod 305 is disposed within a tube 310 that includes, consists essentially of, or consists of Cu or a Cu alloy. The rod 305 may include, consist essentially of, or consist of one or more metals having mechanical strength (e.g., tensile strength, yield strength, etc.) greater than that of rods 105 utilized to fabricate monofilaments 100. For example, the rod 305 may include, consist essentially of, or consist of Ta or a Ta alloy (e.g., a Ta—W alloy such as Ta-3W), Nb or a Nb alloy (e.g., a Nb—W alloy such as Nb-12W, Nb-6W, or Nb-3W, a Nb—Ta alloy, a Nb—Ta alloy containing one or more additional alloying elements such as Hf, Ti, Zr, Ta, V, Y, Mo, or W, or any other material disclosed herein as suitable for diffusion barriers. In other embodiments, the rod 305 may include, consist essentially of, or consist of a Nb alloy having greater mechanical strength than substantially pure Nb. For example, rods 305 (and therefore stabilizing elements) in accordance with embodiments of the invention may include, consist essentially of, or consist of an alloy of Nb with one or more of Hf, Ti, Zr, Ta, V, Y, Mo, or W. For example, stabilizing elements in accordance with embodiments of the invention may include, consist essentially of, or consist of Nb C103 alloy, which includes approximately 10% Hf, approximately 0.7%-1.3% Ti, approximately 0.7% Zr, approximately 0.5% Ta, approximately 0.5% W, and the balance Nb. In other embodiments, stabilizing elements may include, consist essentially of, or consist of a Nb B66 alloy and/or a Nb B77 alloy.

The rod 305 clad with the tube 310 may subsequently be drawn down to reduce its diameter to, for example, between 0.5 inch and 1.5 inches. The clad rod may be drawn down in multiple stages and may be heat treated during and/or after any or each of the drawing steps for, e.g., strain relief. Once drawn down, the clad rod may be drawn through a shaped die in order to fabricate the stabilizing element 300 shaped for efficient stacking with monofilaments 100 and/or composite filaments 200. For example, as shown in FIG. 3C, a hexagonal die may be utilized to form a stabilizing element 300 having a hexagonal cross-section. In other embodiments, stabilizing elements 300 may have other cross-sections, e.g., square, rectangular, triangular, etc. In various embodiments, stabilizing elements 300 may have cross-sectional sizes and/or shapes substantially the same as cross-sectional sizes and/or shapes of monofilaments 100 and/or composite filaments 200.

Figure 3D:
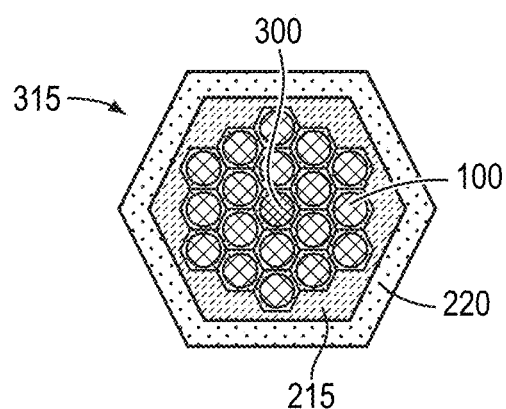
FIG. 3D is a schematic cross-sectional view of a composite filament incorporating a stabilizing element in accordance with various embodiments of the invention.

Once fabricated, one or more stabilizing elements 300 may be inserted into a stack of monofilaments 100, and the resulting assembly may be surrounded with a diffusion-barrier material and a matrix material, drawn down, and optionally shaped to form a stabilized composite filament 315 (e.g., as described above with reference to FIGS. 2A-2E) that incorporates a diffusion barrier 215 between the monofilaments 100 and stabilizing element(s) 300 and the outer matrix 220, as shown in FIG. 3D. In various embodiments of the invention, composite filament may include a diffusion barrier between the stabilizing element 300 and the remaining monofilaments 100 in order to retard or substantially prevent interdiffusion therebetween. In various embodiments, the stabilizing element 300 may be replaced or supplemented with an internal stabilizing matrix that includes, consists essentially of, or consists of, e.g., Cu or a Cu alloy, and such regions may be separated from monofilaments 100 via one or more diffusion barriers. Although FIG. 3D depicts the stabilizing element 300 as having a cross-sectional area substantially the same as that of one of the monofilaments 100, in various embodiments of the invention, the stabilizing element 300 has a cross-sectional area larger than that of a single monofilament 100. For example, the cross-sectional area of the stabilizing element 300 may be at least 1.5 times, at least 2 times, at least 3 times, at least 4 times, at least 5 times, or at least 6 times the cross-sectional area of a monofilament 100.

In embodiments of the invention incorporating stabilizing elements as well as diffusion barriers, the amount of cross-sectional area of the wire imparting additional mechanical strength may be beneficially divided between the diffusion barrier(s) and the stabilizing element(s). That is, the more cross-sectional area of the wire occupied by one or more stabilizing elements, the less cross-sectional area of the wire need be occupied by the diffusion barrier(s), as long as each diffusion barrier has sufficient thickness to retard or substantially eliminate diffusion between the various portions of the wire. Conversely, the use of diffusion barriers in accordance with embodiments of the invention enables the use of one or more stabilizing elements that themselves collectively occupy less of the cross-sectional area of the wire while still imparting the desired mechanical strength (and/or other mechanical properties) to the wire. In various embodiments, the diffusion barrier(s) may collectively occupy at least 1%, at least 2%, at least 3%, at least 4%, or at least 5% of the cross-sectional area of the wire. In various embodiments, the diffusion barrier(s) may collectively occupy less than 15%, less than 12%, less than 10%, less than 9%, less than 8%, less than 7%, less than 6%, or less than 5% of the cross-sectional area of the wire. In embodiments of the invention featuring stabilizing elements, the stabilizing elements and diffusion barriers may collectively occupy less than 25%, less than 20%, less than 15%, or less than 10% of the cross-sectional area of the wire. Stabilizing elements themselves may occupy less than 15% or less than 10% (e.g., approximately 2% to approximately 8%, or approximately 5% to approximately 15%) of the cross-sectional area of the wire. Stabilizing elements may occupy at least 2%, at least 3%, at least 5%, or at least 8% of the cross-sectional area of the wire.

Figure 4A:
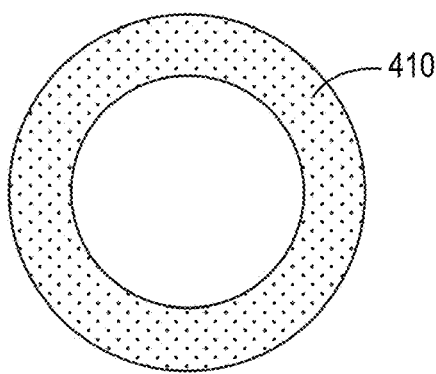
FIG. 4A is a schematic cross-sectional view of a tube utilized to form a superconducting wire in accordance with various embodiments of the invention.
Figure 4B:
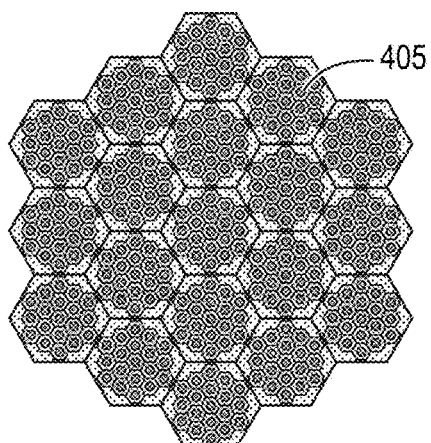
FIG. 4B is a schematic cross-sectional view of a stack of composite filaments utilized to form a superconducting wire in accordance with various embodiments of the invention.

In addition to or instead of being incorporated within one or more composite filaments 200, 315, diffusion barriers in accordance with embodiments of the present invention may be disposed between an outer stabilizing matrix (and/or an inner stabilizing matrix and/or stabilizer proximate the center of the wire) and the composite filaments to advantageously retard or substantially prevent interdiffusion within the superconducting wire. That is, superconducting wires and/or wire preforms may be fabricated utilizing diffusion barriers disposed around assemblies of composite filaments 200, stabilized composite filaments 315, and/or composite filaments lacking their own diffusion barriers. FIGS. 4A-4E depict various stages of the fabrication of an exemplary superconducting wire 400. As shown in FIG. 4B, multiple composite filaments 405 each lacking their own internal diffusion barriers may be stacked together in an arrangement that will subsequently become at least a portion of the core of superconducting wire 400. Each composite filament 405 may be fabricated, for example, similarly to composite filament 200 detailed above but without incorporation of the diffusion barrier 215 arising from the use of tube 210 during fabrication. In other embodiments, the stack of composite filaments may include or be composed of composite filaments 200, composite filaments 315, and/or mixtures thereof with or without composite filaments 405. While FIG. 4B depicts the stacking of 18 different composite filaments 405, embodiments of the invention may include more or fewer composite filaments.

Figure 4D:
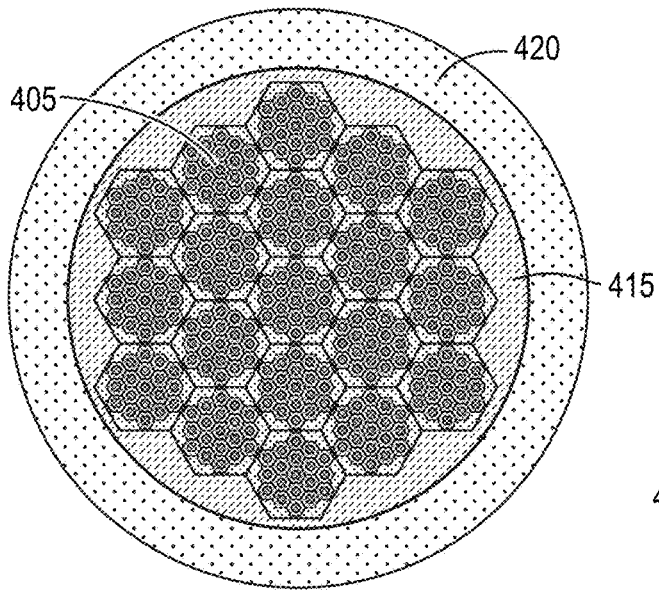
FIG. 4D is a schematic cross-sectional view of a superconducting wire at an initial stage of fabrication in accordance with various embodiments of the invention.
Figure 4C:
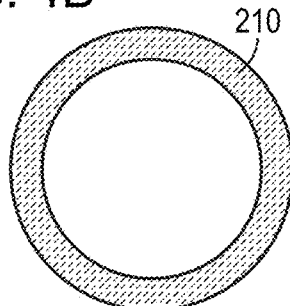
FIG. 4C is a schematic cross-sectional view of a tube utilized to form a diffusion barrier within a superconducting wire in accordance with various embodiments of the invention.
Figure 4E:
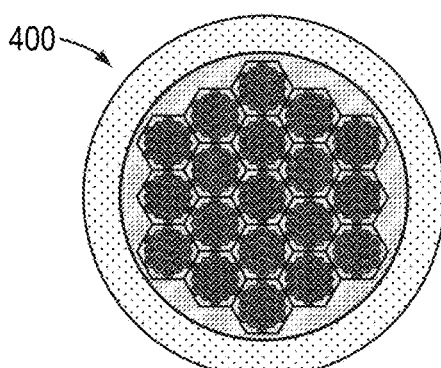
FIG. 4E is a schematic cross-sectional view of a superconducting wire in accordance with various embodiments of the invention.

The stacked assembly of composite filaments may be disposed within a tube 410 that includes, consists essentially of, or consists of Cu or a Cu alloy. In addition, as shown in FIG. 4C, a tube 210 may be disposed around the stacked assembly of composite filaments and within the tube 410 and may therefore form a diffusion barrier in the final wire. Before and/or after the composite filaments are disposed within the tube 510 and the tube 210, the composite filaments, the tube 210, and/or the tube 410 may be cleaned and/or etched (e.g., via a cleaning agent including, consisting essentially of, or consisting of one or more acids) to, for example, remove surface oxides and/or other contaminants. As shown in FIG. 4D, the tube 410 and the tube 210 may be compacted onto the composite filaments by, e.g., swaging, extruding, and/or rolling, and tube 210 may become diffusion barrier 415, and tube 410 may become outer matrix 420. The clad stacked composite filaments may be annealed to promote bonding between the various composite filaments in the stacked assembly. For example, the clad stack may be annealed at a temperature between approximately 300° C. and approximately 500° C. (e.g., approximately 400° C.) for a time of approximately 0.5 hour and approximately 3 hours (e.g., approximately 1 hour). Advantageously, the presence of the diffusion barrier 415 between the composite filaments 405 and the outer matrix 420 substantially prevents diffusion between the Cu of the matrix 420 and the composite filaments 405, thereby preventing the formation of metallic phases having low electrical conductivity (e.g., electrical conductivity lower than Cu and/or than the material of matrix 420). The resulting assembly may be drawn down one or more times to reduce its diameter, as shown in FIG. 4E. Before or after drawing, the superconducting wire 400 may be annealed to, e.g., relax residual stresses and/or promote recrystallization therein.

Figure 4F:
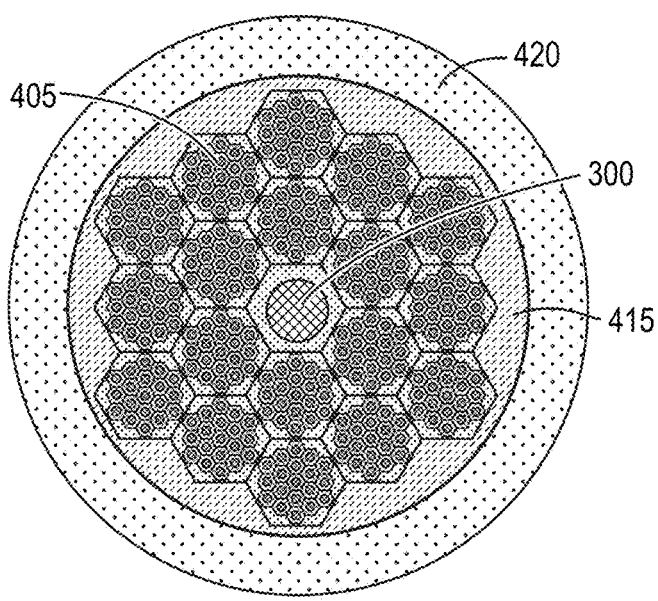
FIG. 4F is a schematic cross-sectional view of a stabilized superconducting wire at an initial stage of fabrication in accordance with various embodiments of the invention.
Figure 4G:
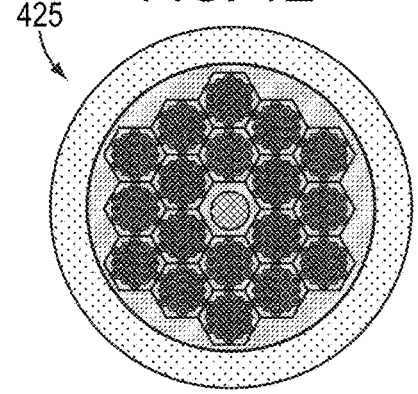
FIG. 4G is a schematic cross-sectional view of a stabilized superconducting wire in accordance with various embodiments of the invention.

As shown in FIGS. 4F and 4G, a similar methodology may be utilized to fabricate stabilized superconducting wires 425 that incorporate one or more diffusion barriers 415 as well as one or more stabilizing elements 300. For example, the assembly of stacked composite filaments may define therewithin one or more voids each sized and shaped to accommodate one or more stabilizing elements 300. Before or after the composite filaments are disposed within the tube 410 and the tube 210, one or more stabilizing elements 300 may be disposed within each of the voids, as shown in FIG. 4F. The resulting assembly may have its diameter reduced by, e.g., drawing and/or extrusion, as shown in FIG. 4G. In various embodiments, a diffusion barrier may be disposed between stabilizing element(s) 300 and the filaments within the wire or wire preform, particularly in embodiments in which the stabilizing element includes, consists essentially of, or consists of Cu. For example, a tube of the desired diffusion barrier material may be disposed around the stabilizing element when the wire preform assembly is assembled, and the entire assembly may be drawn down to the desired wire dimensions. While FIGS. 4F and 4G depicts the superconducting wire 425 having a single stabilizing element 300 disposed substantially at the center of the stacked assembly of composite filaments, in accordance with embodiments of the invention, one or more stabilizing elements 300 may be disposed at other locations within the stacked assembly in addition to or instead of the stabilizing element 300 disposed at the center. Although FIGS. 4F and 4G depict the stabilizing element 300 as having a cross-sectional area substantially the same as that of one of the composite filaments 405, in various embodiments of the invention, the stabilizing element 300 has a cross-sectional area larger than that of a single composite filament 405. For example, the cross-sectional area of the stabilizing element 300 may be at least 1.5 times, at least 2 times, at least 3 times, at least 4 times, at least 5 times, or at least 6 times the cross-sectional area of a composite filament 405.

In various embodiments, the superconducting wire 400, 425 lacks a diffusion barrier 415 therewithin, and thus, tube 210 is not utilized in formation thereof, and diffusion barriers 215 in one or more of the individual composite filaments are utilized to retard or substantially prevent interdiffusion. In other embodiments, as shown in FIG. 4D-4G, the individual composite filaments 405 may lack diffusion barriers therewithin, and diffusion barrier 415 is present within the superconducting wire 400, 425. In such embodiments, the tubes 110 and/or 205 may incorporate therewithin Sn which advantageously reacts with the Nb of the filaments during subsequent thermal processing to form a superconducting phase (e.g., $Nb_3Sn$). In other embodiments, diffusion barrier 415 is present in addition to diffusion barriers 215 within the individual composite filaments.

In various embodiments, the superconducting wire 400, superconducting wire 425, composite filament 4015, composite filament 200, and/or stabilized composite filament 315 may be mechanically processed for diameter reduction and/or to promote bonding between their constituent elements prior to wire drawing steps. For example, the superconducting wire 400, superconducting wire 425, composite filament 4015, composite filament 200, and/or stabilized composite filament 315 may be extruded, swaged, and/or rolled prior to the final drawing step(s). In various embodiments, the superconducting wire 400, superconducting wire 425, composite filament 4015, composite filament 200, and/or stabilized composite filament 315 may be heat treated during and/or after each of multiple different drawing steps for strain relief. For example, during and/or after one or more of the drawing steps, the superconducting wire 400, superconducting wire 425, composite filament 4015, composite filament 200, and/or stabilized composite filament 315 may be annealed at temperatures from approximately 360° C. to approximately 420° C. for a time period of, e.g., approximately 20 hours to approximately 40 hours.

In various embodiments of the present invention, the superconducting wire 400 or superconducting wire 425 may be cooled below the critical temperature of the filaments therewithin and utilized to conduct electrical current. In some embodiments, multiple superconducting wires 400 and/or superconducting wires 425 are coiled together to form a single superconducting cable.

While some superconducting wires 400, 425 (e.g., those incorporating Nb—Ti-containing filaments) may be utilized directly in superconducting applications, the fabrication processes for various other superconducting wires 400, 425 may incorporate one or more steps to incorporate a portion of the superconducting phase. For example, $Nb_3Sn$ super-conducting phases, once formed, are typically brittle and may not be further drawn or otherwise mechanically deformed without damage. Thus, embodiments of the present invention may be utilized to fabricate superconducting wires 400, 425 that incorporate Nb and Sn separate from each other; once the wires 400, 425 are mostly or fully fabricated, the wires 400, 425 may be annealed to interdiffuse the Nb and Sn and form the superconducting $Nb_3Sn$ phase therewithin. For example, the drawn wire may be annealed at temperatures from approximately 600° C. to approximately 700° C. for a time period of, e.g., approximately 30 hours to approximately 200 hours. In various embodiments, one or more of the Cu-based tubes 110, 205, or 310 may incorporate Sn therewithin; e.g., one or more of the tubes may include, consist essentially of, or consist of a Cu—Sn alloy (that includes, e.g., 13-15% Sn). Such materials are ductile, enabling the fabrication of the various filaments and wires as detailed herein. Thereafter, the wire 400, 425 may be annealed, resulting in interdiffusion and the formation of the superconducting $Nb_3Sn$ phase at least at the interface between the Nb and the Cu—Sn.

In other embodiments, pure Sn or an Sn alloy (e.g., an Sn alloy with Cu or magnesium (Mg)) may be incorporated (e.g., in the form of a rod or tube) within one or more of the stacks utilized to form composite filaments 200, stabilized composite filaments 315, and/or wires 400, 425; after formation of the composite filaments 200, stabilized composite filaments 315, and/or wires 400, 425 as detailed herein, an annealing step may be performed to form the superconducting $Nb_3Sn$ phase.

In various embodiments, at least the Nb within a portion of one or more diffusion barriers within a wire reacts as described above to form a superconducting phase, and this reacted portion of the diffusion barrier may therefore contribute to the superconductive conductivity of the wire during operation. For example, an inner or outer portion of a diffusion barrier may react with, e.g., Sn or an Sn alloy, to form a superconducting phase substantially identical or similar to that formed from the filaments of the wire. In such embodiments, the thickness of the diffusion barrier is typically sufficiently large such that the entirety of the diffusion barrier does not react to form a superconducting phase. Thus, at least a portion of the diffusion barrier remains unreacted and contributes resistance to interdiffusion as well as mechanical strength to the wire, as described herein. In various embodiments, the diffusion barrier may be a multi-layer structure containing one or more annular layers including, consisting essentially of, or consisting of Nb as well as one or more annular layers including, consisting essentially of, or consisting of a Nb alloy or Nb—Ta alloy as detailed herein. The alloy layer(s) may provide most of the diffusion resistance, while at least a portion of the Nb layer(s) may react (with surrounding Sn in the Cu matrix, for example) during heat treatment to become part of the superconducting phase. For example, the diffusion barrier may include, consist essentially of, or consist of an alloy layer sandwiched between two different Nb layers. In another example, an inner Nb layer may be surrounded by an outer alloy layer or vice versa.

FIG. 5 is a cross-sectional view of a superconducting wire 500 incorporating a diffusion barrier in accordance with embodiments of the present invention. As shown, the diffusion barrier 510 is disposed between a Cu stabilizing core 520 of the wire 500 and an outer bronze matrix 530 containing Nb-based filaments 540. FIG. 6 is a cross-sectional view of another superconducting wire 600 incorporating a diffusion barrier in accordance with embodiments of the present invention. As shown, the diffusion barrier 610 is disposed between inner Sb—Cu—Nb-based filaments 620 at the core of the wire 600 and an outer Cu stabilizer 630.

EXAMPLES

A series of experiments were performed to evaluate Nb—W alloy materials in terms of processability and thus suitability for use as diffusion barriers in heavily drawn superconducting wires. The fabrication of the materials began with the melting of three different Nb—W alloys in a button hearth. The three different samples had 2.9 weight percent W, 5.7 weight percent W, and 11.4 weight percent W, and all three buttons weighed 680.4 grams after fabrication. Center sections were extracted from each of the buttons via cutting on a bandsaw and deburring with a file. The thickness of each section was measured and utilized as the starting thickness for a series of rolling experiments. The samples were rolled on a mini-mill at a nominal 5% pass schedule. Periodically during the rolling, the thicknesses of the samples were measured, and a portion of each sample was extracted for hardness testing. No intermediate annealing or other treatments were performed on the samples. The results of the rolling experiments are shown in Table 1 below, which reports thicknesses and corresponding reductions in area (ROA).

TABLE 1

Reduction in Thickness for Rolling Experiments

| Sample 1 Nb-2.9% W | | Sample 2 Nb-5.7% W | | Sample 3 Nb-11.4% W | |
|---|---|---|---|---|---|
| Thickness (in) | ROA (%) | Thickness (in) | ROA (%) | Thickness (in) | ROA (%) |
| 0.462 | 0 | 0.475 | 0 | 0.475 | 0 |
| 0.422 | 9 | 0.422 | 11 | 0.425 | 11 |
| 0.388 | 16 | 0.380 | 18 | 0.392 | 17 |
| 0.352 | 24 | 0.355 | 25 | 0.360 | 24 |
| 0.290 | 37 | 0.292 | 39 | 0.292 | 39 |
| 0.255 | 45 | 0.255 | 46 | 0.260 | 45 |
| 0.190 | 59 | 0.192 | 60 | 0.190 | 60 |
| 0.125 | 73 | 0.122 | 74 | 0.128 | 73 |

Subsequently, the hardness of the rolled samples was evaluated using a Vickers hardness test using a Vickers test force (HV) of 0.5 kg on a 401 MVD Knoop/Vickers Micro-indentation Tester, available from Wilson Wolpert Instruments of Aachen, Germany. Each sample was polished and mounted prior to the hardness testing. Three measurements were performed on each sample using a 136° pyramidal diamond indenter in accordance with the ASTM E384 standard (ASTM International, West Conshohocken, Pa., the entire disclosure of which is incorporated by reference herein), and the average and standard deviation were calculated. The results of the hardness tests are reported in Tables 2-4 below.

TABLE 2

Hardness Measurements for Sample 1 (Nb-2.9% W)

| Thickness (in) | ROA (%) | Hardness (HV0.5) | | |
|---|---|---|---|---|
| | | Test | Std. Dev. | Average |
| 0.462 | 0 | 136.5 | 1.1 | 136.1 |
| | | 134.9 | | |
| | | 136.9 | | |

TABLE 2-continued

Hardness Measurements for Sample 1 (Nb-2.9% W)

| Thickness (in) | ROA (%) | Hardness (HV0.5) | | |
|---|---|---|---|---|
| | | Test | Std. Dev. | Average |
| 0.422 | 9 | 125.9 | 5.2 | 125.1 |
| | | 129.8 | | |
| | | 119.5 | | |
| 0.388 | 16 | 178.0 | 6.8 | 182.4 |
| | | 178.9 | | |
| | | 190.2 | | |
| 0.352 | 24 | 183.1 | 7.1 | 176.6 |
| | | 169.1 | | |
| | | 177.1 | | |
| 0.290 | 37 | 143.8 | 5.7 | 142.3 |
| | | 147.1 | | |
| | | 136.0 | | |
| 0.255 | 45 | 184.6 | 3.1 | 188.0 |
| | | 190.5 | | |
| | | 189.0 | | |
| 0.190 | 59 | 190.8 | 1.8 | 192.1 |
| | | 191.4 | | |
| | | 194.2 | | |
| 0.125 | 73 | 202.3 | 5.4 | 196.1 |
| | | 192.3 | | |
| | | 193.8 | | |

TABLE 3

Hardness Measurements for Sample 2 (Nb-5.7% W)

| Thickness (in) | ROA (%) | Hardness (HV0.5) | | |
|---|---|---|---|---|
| | | Test | Std. Dev. | Average |
| 0.475 | 0 | 139.3 | 4.2 | 141.8 |
| | | 139.5 | | |
| | | 146.7 | | |
| 0.422 | 11 | 182.3 | 3.2 | 179.2 |
| | | 176.0 | | |
| | | 179.3 | | |
| 0.390 | 18 | 194.2 | 5.8 | 187.5 |
| | | 184.1 | | |
| | | 184.2 | | |
| 0.355 | 25 | 204.7 | 7.8 | 200.5 |
| | | 205.4 | | |
| | | 191.5 | | |
| 0.292 | 39 | 197.9 | 10.1 | 208.9 |
| | | 211.1 | | |
| | | 217.8 | | |
| 0.255 | 46 | 191.4 | 7.9 | 199.3 |
| | | 199.2 | | |
| | | 207.2 | | |
| 0.192 | 60 | 223.6 | 10.4 | 214.3 |
| | | 216.3 | | |
| | | 203.1 | | |
| 0.122 | 74 | 231.3 | 2.2 | 228.9 |
| | | 226.9 | | |
| | | 228.6 | | |

TABLE 4

Hardness Measurements for Sample 3 (Nb-11.4% W)

| Thickness (in) | ROA (%) | Hardness (HV0.5) | | |
|---|---|---|---|---|
| | | Test | Std. Dev. | Average |
| 0.475 | 0 | 188.6 | 1.0 | 188.1 |
| | | 188.8 | | |
| | | 186.9 | | |
| 0.425 | 11 | 202.1 | 13.2 | 216.8 |
| | | 220.9 | | |
| | | 227.5 | | |

TABLE 4-continued

Hardness Measurements for Sample 3 (Nb-11.4% W)

| Thickness (in) | ROA (%) | Hardness (HV0.5) | | |
| --- | --- | --- | --- | --- |
| | | Test | Std. Dev. | Average |
| 0.392 | 17 | 220.4 | 7.0 | 225.5 |
| | | 222.7 | | |
| | | 233.5 | | |
| 0.360 | 24 | 240.3 | 4.9 | 245.9 |
| | | 248.6 | | |
| | | 248.8 | | |
| 0.292 | 39 | 236.0 | 2.1 | 234.8 |
| | | 235.9 | | |
| | | 232.4 | | |
| 0.260 | 45 | 260.7 | 4.0 | 263.0 |
| | | 260.7 | | |
| | | 267.6 | | |
| 0.190 | 60 | 251.2 | 2.9 | 254.0 |
| | | 253.9 | | |
| | | 257.0 | | |
| 0.128 | 73 | 256.4 | 9.5 | 258.2 |
| | | 249.7 | | |
| | | 268.4 | | |

As indicated on the above data tables, all three of the tested samples exhibited good ductility when processed via cold working to ROA values of over 70%. The measured behavior is similar to that exhibited by pure niobium samples and indicates the suitability of these sample alloys for use as diffusion barriers in state-of-the-art superconducting wires. The hardness of each alloy increased slightly as a function of increased W content and increased ROA, as expected, but the samples all exhibited good ductility at all conditions tested. None of the samples cracked or were otherwise damaged by the cold working utilized in the testing procedure, and all samples deformed quite uniformly during testing.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A superconducting wire possessing diffusion resistance and mechanical strength, the superconducting wire comprising:
   a wire matrix comprising Cu; and
   a plurality of composite filaments embedded within the wire matrix,
   wherein:
   each composite filament comprises (i) a plurality of monofilaments, (ii) a diffusion barrier comprising a Nb alloy containing 0.1%-20% W or a Nb—Ta alloy containing 0.1%-20% W and extending through an axial dimension of the composite filament and surrounding the plurality of monofilaments, and (iii) a cladding comprising Cu surrounding the diffusion barrier, the diffusion barrier separating the cladding from the plurality of monofilaments,
   the diffusion barriers collectively occupy 1%-20% of a cross-sectional area of the superconducting wire, and
   each monofilament comprises a core comprising Nb and, surrounding the core, a cladding comprising Cu.

2. The wire of claim 1, further comprising, disposed between the monofilaments and the diffusion barrier of at least one of the composite filaments, an annular region comprising a Nb-based superconducting phase.

3. The wire of claim 2, wherein the annular region comprises $Nb_3Sn$.

4. The wire of claim 2, wherein the annular region conforms to and is contact with the diffusion barrier.

5. The wire of claim 1, wherein the diffusion barriers collectively occupy 1%-10% of the cross-sectional area of the superconducting wire.

6. The wire of claim 1, wherein the diffusion barriers collectively occupy 2%-10% of the cross-sectional area of the superconducting wire.

7. The wire of claim 1, wherein the diffusion barriers collectively occupy 3%-10% of the cross-sectional area of the superconducting wire.

8. The wire of claim 1, wherein the core of each monofilament comprises Nb alloyed with at least one of Ti, Zr, Hf, Ta, Y, or La.

9. The wire of claim 1, wherein the core of each monofilament comprises $Nb_3Sn$.

10. The wire of claim 1, wherein the diffusion barrier comprises Nb-6W or Nb—Ta-3W.

11. The wire of claim 1, wherein the diffusion barrier additionally contains one or more alloying elements selected from the group consisting of Ru, Pt, Pd, Rh, Os, Ir, Mo, Re, or Si.

12. The wire of claim 1, wherein a yield strength of the superconducting wire is at least 100 MPa.

13. The wire of claim 1, wherein each of the composite filaments has a hexagonal cross-sectional shape.

14. The wire of claim 1, wherein each of the monofilaments has a hexagonal cross-sectional shape.

15. The wire of claim 1, further comprising a stabilizing element disposed within the plurality of composite filaments, the stabilizing element comprising a Ta alloy containing 0.1%-20% W, a Nb alloy containing 0.1%-20% W, or a Nb—Ta alloy containing 0.1%-20% W.

16. The wire of claim 1, wherein the diffusion barrier comprises the Nb alloy containing 0.1%-20% W.

17. The wire of claim 1, wherein the diffusion barrier comprises the Nb—Ta alloy containing 0.1%-20% W.

18. The wire of claim 15, wherein the stabilizing element comprises the Ta alloy containing 0.1%-20% W, the Ta alloy being substantially free of Nb.

19. The wire of claim 15, wherein the stabilizing element comprises the Nb alloy containing 0.1%-20% W, the Nb alloy being substantially free of Ta.

20. The wire of claim 15, wherein the stabilizing element comprises the Nb—Ta alloy containing 0.1%-20% W.

* * * * *